US00RE39173E

(19) United States
(12) Reissued Patent
Hourai et al.

(10) Patent Number: US RE39,173 E
(45) Date of Reissued Patent: Jul. 11, 2006

(54) SILICON SINGLE CRYSTAL WAFER

(75) Inventors: Masataka Hourai, Ogi-gun (JP); Eiji Kajita, Saga (JP)

(73) Assignee: Sumitomo Mitsubishi Silicon Corporation, Tokyo (JP)

(21) Appl. No.: 10/323,758

(22) Filed: Dec. 20, 2002

Related U.S. Patent Documents

Reissue of:
(64) Patent No.: 6,245,430
Issued: Jun. 12, 2001
Appl. No.: 09/389,213
Filed: Sep. 3, 1999

U.S. Applications:
(62) Division of application No. 08/990,187, filed on Dec. 12, 1997, now Pat. No. 5,954,873.

(51) Int. Cl.
*B23B 25/04* (2006.01)

(52) U.S. Cl. ..... 428/450; 117/13; 117/20
(58) Field of Classification Search ..... 117/13, 117/20; 428/450
See application file for complete search history.

(56) References Cited

U.S. PATENT DOCUMENTS 5,138,179 A * 8/1992 Baba et al. ..... 117/15
6,113,687 A * 9/2000 Horai et al. ..... 117/20
6,327,219 B1 * 12/2001 Zhang et al. ..... 367/128

FOREIGN PATENT DOCUMENTS

JP 8-268794 * 10/1996

OTHER PUBLICATIONS

Proceedings of the 18th International Conference on Defects in Semiconductors, Part 4, Sendai, Japan, Jul. 23–28, 1995, Trans Tech Publications.*

Electrochemical Society, Reno, Nevada, May 21–26 Spring Meeting (1995), 4pp.*

Journal of Crystal Growth, vol. 59 (1982), pp. 1–12. Takao ABE, Behavior of Point Defect FZ and CZ Silicon Crystals, pp. 272–288, "Point and Secondary Defects of CZ Crystals", Mar. 1990 (with partial English Translation).*

T. Nagashima et al., Extended Abstract (The 54th Autumn Meeting, 199), The Japan Society fo Applied Physics, AN 29a–HA–7 pp. 303, "Observation of Grown–in–Defects in CZ–Si Crystals", Sep. 27, 1993 (with partial English translation).*

* cited by examiner

*Primary Examiner*—Felisa Hiteshew
(74) *Attorney, Agent, or Firm*—Morrison & Foerster LLP

(57) ABSTRACT

A method of making silicon single crystal wafers free of grown-in defects is provided. These wafers are formed from silicon single crystal manufactured by the Czochralski method. Careful control of the pulling rate, V (mm/min), and the temperature gradient G (° C./mm) permits crystals to be formed that are free from OSF rings, and other types of defects.

22 Claims, 5 Drawing Sheets

SILICON SINGLE CRYSTAL WAFER

Matter enclosed in heavy brackets [ ] appears in the original patent but forms no part of this reissue specification; matter printed in italics indicates the additions made by reissue.

This application is a Division of application Ser. No. 08/990,187 Filed on Dec. 12, 1997, allowed U.S. Pat. No. 5,954,873.

BACKGROUND OF THE INVENTION

1. Field of the Invention

The present invention relates to a silicon single crystal wafer used for manufacturing semiconductor devices. The wafer is preferably formed from a silicon single crystal that has been pulled by the Czochralski method (hereinafter referred to as the CZ method). Pulling is defined herein as forming a silicon single crystal rod. Such rods are used as the raw material of the wafers.

2. Prior Art

The silicon single crystal wafer used in semiconductor elements is manufactured mainly by the CZ method. The CZ method for pulling a cylindrical silicon single crystal involves dipping a seed crystal into molten liquid silicon in a quartz crucible, and then pulling up the seed crystal, while rotating the crucible and crystal. The silicon single crystal rod can be pulled at high (0.8–2.0 mm/min), medium (0.5–0.8 mm/min) or low (less than 0.5 mm/min) pulling speeds in the conventional CZ method. Most silicon single crystals are pulled at high pull-up speeds.

The silicon single crystal pulled by the CZ method as hereinabove described is prone to oxidation-induced stacking faults (OSF) that form a ring in the wafer made from the crystal under thermal oxidation process (for example, 1000–1200° C.×1–10 hr). It is known that the ring formed by OSF shifts toward the periphery of the single crystal as the pulling speed is increased. At present, high velocity pulling rate wafers are used to manufacture LSI. These wafers are formed from silicon single crystal that has been pulled at a relatively high pulling speed (1.0–2.0 mm/min) to shift the OSF ring to the outermost periphery of the single crystal.

There exist several types of minute defects (called grown-in defects) in silicon single crystal pulled at such high pulling rate, that deteriorate the gate oxide integrity (GOI) of MOS devices. Moreover, such grown-in defects are thermally stable, and remain in the active region near the wafer surface, where they deteriorate not only the GOI but also the junction leakage characteristic (e.g. M. Horikawa et al., Semiconductor Silicon, 1994. p 987 the contents of which are hereby incorporated by reference).

The increasing level of integration of MOS semiconductor elements like LSI has generated demand for thinner gate oxide films resulting in a shallower diffusion layer of the source-drain. Thinner gate oxide films require an enhanced GOI of gate oxide film and a reduction of the junction leakage current. The high pulling rate wafers presently being used for LSIs are inferior in these critical properties, making it difficult to develop highly integrated MOS semiconductors.

Recently, a method of pulling single crystals at medium or low pulling rates of 0.8 mm/min or less, was proposed in Provisional Patent Publication No. Hei 2-267195. Silicon single crystal wafers raised at these pulling rates also suffer from poor quality.

Generally, the temperature distributions inside the single crystal depends on the hot zone structure of the CZ furnace.

This distribution does not undergo much change, even though the pulling rate can vary. Because the temperature distribution remains constant, there are predictable relationships between the pulling rate and the defect developing regions as shown in FIG. 1. The pulling rates needed to produce these defects developing regions may vary from one CZ furnace to another, but these regions are always present.

For medium velocity pulling (pulling rate=0.6–0.8 mm/min), an OSF ring develops at about one half the distance from the center of the silicon single crystal wafer. The wafer on each side of the ring has different properties. The gate oxide film in the region outside the OSF ring has good GOI, while inside the ring of the GOI is poor due to several types of grown-in defects.

The types of defects include infrared scattering defects formed while pulling the crystal. Observed by infrared tomography, this type of defect has a measured density of approximately $10^6$ spots/cm$^3$. This fault is believed to be a kind of oxygen precipitate and has enough thermal stability to remain in the device active region even after the heat treatment process, causing deteriorations of the wafer's junction leakage characteristics.

The width of the OSF ring usually ranges from 3–10 mm, and has about $10^4$ spots/cm$^2$, enough to degrade the junction leakage characteristics of semiconductor elements. When the OSF ring is heat treated, oxygen precipitates develop at a density of $10^8$–$10^9$ spots/cm$^3$. The thermally stable oxygen precipitates actually grow larger under a 1250° C. heat treatment. Accordingly, heat treatments worsen the semiconductor properties of the OSF ring.

When the pulling rate of the silicon single crystal is decreased to 0.5 . 0.6 mm/min, as shown in FIG. 1(B), the diameter of the OSF ring shrinks toward the center of the wafer. With the area outside the ring enlarged, the GOI is improved, but now dislocation clusters appear at the perpendicular region of the wafer. This ring of dislocation clusters is roughly 10–20 μm size and contains $10^3$ spots/cm$^3$. It is well-known that dislocation clusters also cause degradation of the characteristics of semiconductor elements.

Silicon single crystals pulled by conventional CZ methods contain a 1–2×$10^{18}$ atoms/cm$^3$ concentration of oxygen impurities. Oxygen contamination is caused by oxygen deposition during the heat treatment step (for example, 600–1150° C. for 10–70 hr) in the device processing. The oxygen precipitates act as a site for gettering heavy metal contaminants during the device processing and cause degradation of the device characteristics.

Greater oxygen precipitates inside the OSF ring increases the gettering capacity (called IG capacity), while outside the OSF ring, where dislocation clusters are produced, oxygen precipitates hardly takes place, and IG capacity is low.

For crystals pulled at a medium velocity of 0.5–0.8 mm/min pull-up speed, an OSF ring is formed. The high density of defects that develop both within and around the ring make wafers made from these crystals unsuitable for manufacturing highly integrated semiconductor elements.

In contrast, wafers pulled at a low velocity with a pulling rate of 0.5 mm/min or less, as shown in FIG. 1C do not form the OSF ring, nor the infrared scattering defects that occur inside this ring. However, dislocation clusters develop all over the wafer. Dislocation clusters give rise to lowered device characteristics and increased IG capacity as was hereinabove described. Thus, low pulling rate wafers are also not suitable for manufacturing highly integrated semiconductor elements.

Silicon single crystals pulling by conventional CZ methods develop deleterious defects at high, medium and low pull-up speeds. Thus it appeared impossible to produce wafers suitable for manufacturing highly integrated semiconductor elements using this method.

SUMMARY OF THE INVENTION

Accordingly, one object of this invention is to provide high quality silicon single crystal wafers pulled by the CZ method, that are substantially defect free.

Another object of the invention provides a process of making low defect silicon crystal wafers. A further object of the invention provides for using these wafers to develop highly integrated semiconductor elements, including MOS semiconductor elements.

These and other objects of the present invention have been satisfied by the discovery of the process of pulling silicon single crystals using the CZ method over conditions that produce very few defects in the crystal.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1A:
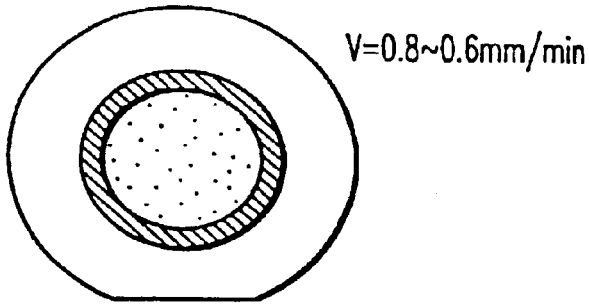
FIG. 1A PRIOR ART
FIG. 1 shows schematic views of defect distributions in silicon single crystal wafers pulled by the CZ method.
Figure 1B:
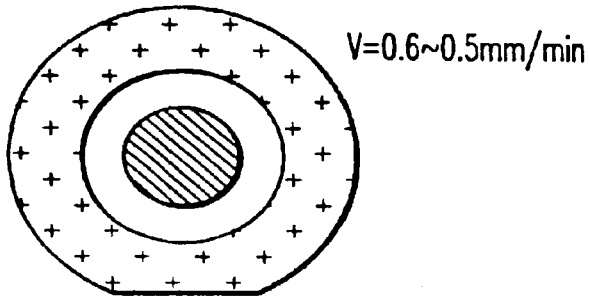

According to the method of the present invention, a silicon single crystal is preferably formed using the CZ method, wherein the ratio of the pulling rate, V (mm/min), to the temperature gradient, G (mm/° C.), is 0.20–0.22 $mm^2$/° C. min at the center of the crystal, and 0.20 $mm^2$/° C. min or more at the outer surface of the crystal. In a preferred embodiment of the present invention, the V/G ratio has different ranges in two concentric regions of the silicon single crystal. In the first concentric region, defined from the center of the crystal to a first region outer boundary that is preferably 20–40 mm, more preferably 25–35 mm, even more preferably 30 mm, inside of the outer surface of the crystal, the V/G ratio is maintained at 0.20–0.22 $mm^2$/° C. min. In the second concentric region, defined from the first region outer boundary to the outer surface of the crystal, the V/G ratio is maintained at 0.20–0.33 $mm^2$/° C.·min.

In the present invention, the temperature gradient near the outer surface of the crystal is preferably controlled by inhibiting the flow of heat from portions of the crystal near the molten silicon to cooler portions further away from this point. Accordingly, the present invention preferably provides for crystal pulling equipment that is configured to prevent excessive heat transfer up from the molten silicon and through the outer surface of the crystal.

The silicon single crystals of the present invention, which may preferably be made by the process of the present invention, are essentially defect free, containing less than 100 spots/$cm^3$, preferably less than 10 spots/$cm^3$, even more preferably less than 1 spot/$cm^3$. These single crystals are preferably cut into wafers that are preferably manufactured into semiconductor elements, preferably for use in semiconductor devices. In one preferred embodiment, the wafers are used in highly integrated semiconductor elements, such as MOS semiconductor elements and LSI elements.

In conventional CZ methods for pulling silicon single crystals, the temperature gradient is largest near the surface of the crystal and smallest at its center. This difference in the temperature gradient is attributed to how heat is supplied to melt the silicon inside the CZ furnace. In conventional CZ crystal pulling equipment, the heating element is positioned below the crystal. Thermal current flows from the solid-liquid interface upward along the axis of the crystal and then outwards in the radial direction toward the periphery of the crystal. Excess heat is removed at the upper periphery of the crystal away from the solid-liquid interface, causing a larger temperature gradient at the crystal periphery, compared to the crystal center. Conventional CZ furnaces are usually designed for rapid cooling causing G to increase at the crystal periphery, and V/G to decrease in the radial direction from the center toward the periphery. For such a CZ furnance, even when the V/G value at the crystal center is in the no-fault region of FIG. 2, it decreases enough near the periphery to traverse the region where the dislocated clusters appear.

In contrast, a CZ furnance that prevents the crystal from cooling rapidly has heat flow more directed up through the crystal center instead of escaping at the crystal periphery. This results in the temperature gradient at the crystal periphery to be equal to or even smaller than the temperature gradient in the center of the crystal. Consequently, a CZ furnance that permits little crystal cooling maintains constant V/G values in the radial direction from the crystal center all the way to its periphery. Accordingly, using such a CZ furnace permits crystals to form in the no-fault region, throughout the entire radial direction of the crystal. As a result, a low pulling rate crystal can be made having no OSF ring near the center and no dislocation clusters near its periphery.

The diameter of the OSF ring varies depending on the pulling rate of the crystal. The ring diameter shrinks with decreasing pulling rate. The OSF ring diameter is sensitive to the hot zone structure of the crystal pulling equipment; crystals pulled with equipment having different hot zone structure of the CZ furnace will have different OSF ring diameters even at the same pulling rate.

Two parameters are critical for controlling the diameter of the OSF ring; the single crystal pulling rate V (mm/min), and the inside-crystal temperature gradient G (° C./min) in the direction of the pulling axis (also called the axial direction) in a high temperature zone from the melting point of silicon to 1300° C. OSF ring diameter can be determined by the ratio of V/G, regardless of the crystal pulling equipment used.

Manipulating V/G in order to eliminate the OSF ring does not necessarily produce a low defect silicon single crystal Two grown-up defects including infrared scattering faults and dislocation clusters can remain in the crystal.

The V/G value effects the density and distribution of all types of defects in the crystal. Temperature distributions from the shoulder of the single crystal to the solid-liquid interface at 100 mm intervals were determined by global heat transfer analysis model (S. Miyahara, S. Kobayashi, T. Fujiwara, T. Kubo and H. Fujiwara: J. Cryst. Growth 99,696 (1990), and T. Fujiwara, S. Inami, S. Miyahara, S. Kobayashi, T. Kubo and H. Fujiwara; J. Cryst. Growth 128,275 (1993) the contents of which are hereby incorporated by reference). In this heat transfer analysis, if the effect of convention inside the melt on the temperature distribution is not taken into account, then the result will give a solid-liquid interface configuration different from the actual one. Due to this effect, it is understood that the temperature distribution at the high temperature zone, particularly near the solid-liquid interface, might be somewhat different from the actual one. In order to overcome this problem with the analysis model, and obtain a more accurate temperature distribution at the high temperature zone, the configuration of the solid-liquid interface of each position was measured with an actual crystal. Then with the temperature at the interface as the melting point of silicon, and taking this temperature and the temperature at the crystal surface given by the aforementioned heat transfer calculation as the boundary conditions, the axial temperature distribution inside the crystal was again calculated, and from this calculation the radial temperature distribution along axial direction of the crystal was calculated. The radial direction of the crystal extends from its center axis out to the crystal's periphery, perpendicular to the axial direction. Taking the radial direction position on the abscissa and the V/G value on the ordinate, the defects distribution are depicted in FIG. 2.

Figure 2:
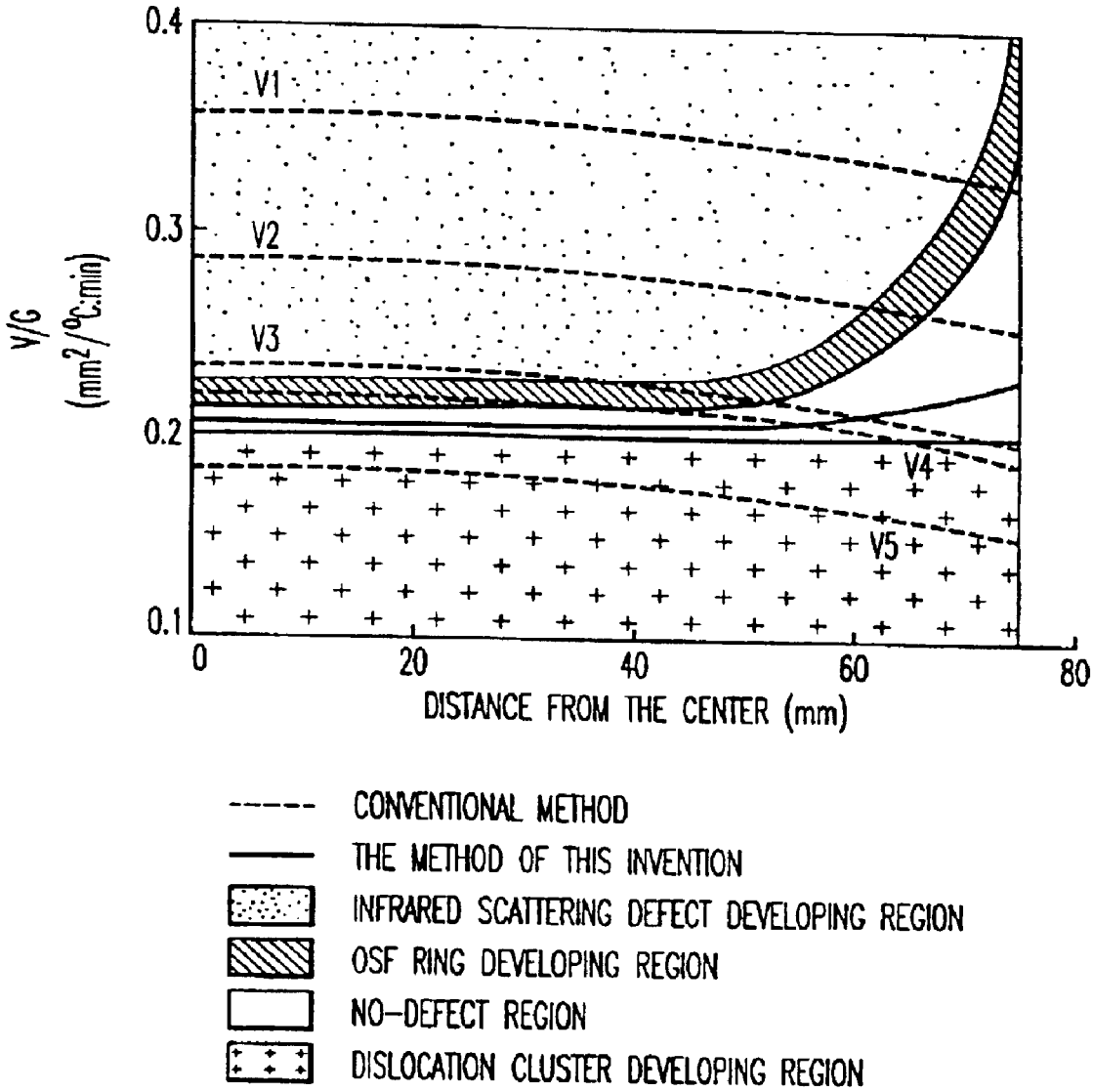
FIG. 2 is a graph showing the relationship (V/G curve) between the position in the radial direction of the crystal on the abscissa and the V/G value on the ordinate. The faults distribution indicate the effect of the slope of the V/G curve on the development of defects.

As is evident from FIG. 2, where the V/G value is not more than 0.20 $mm^2/°$ C. min, the dislocation clusters are formed over the entire radial cross section of the crystal. As the V/G value increases from 0.20 $mm^2/°$ C. min, the crystal structure shifts from the defect free region to OSF ring and finally to the infrared scattering defect region. The defect free region can only extend across the entire radial direction of the crystal when the V/G value is constant (0.20 $mm^2/°$ C. min). The upper boundary of V/G for forming the defect free region is (0.22 $mm^2/°$ C. min) moving from the center of the crystal to a distance of 30 mm inside its periphery. From this point to the crystal periphery, the defect free region expands over a much wider range of V/G. Even though hot zone structure of crystal pulling equipment can vary, the variety of defects in the silicon single crystal wafers will be distributed in conformity to this graph.

FIG. 2 shows that when the pulling rate is $V_1$, the infrared scattering defects occurring the crystal region where the V/G curve traverses the infrared scattering vault developing region, and the OSF ring develops in the crystal region where it tranverses the OSF ring developing region. Thus, for a pulling rate of $V_2$, the OSF ring develops at the outermost periphery of the wafer, and the infrared scattering defect forms in the range inside thereof. Lower pulling rates are represented in FIG. 2 as $V_2$, $V_3$, $V_4$, and $V_5$.

FIG. 2 demonstrates that in pulling a silicon single crystal by the CZ method, there can exist V/G value where no defects are formed in the single crystal. However, in the conventional pulling methods, the V/G value decreases close to the periphery of the crystal, irrespective of the pulling rate. This makes the formation of a defect free silicon single crystal impossible at any pulling rate using the conventional CZ method.

The V/G value decreases near the periphery of the crystal because the radial temperature gradient inside the crystal is larger at the periphery than at the center. Thus with V set constant, the V/G value decreases when going from the center to the periphery of the crystal. Because of this, it is impossible to make the wafer free of defects all over its radial direction, notwithstanding the availability of a possible range of V/G where defect free occur as shown in FIG. 2.

Figure 1C:
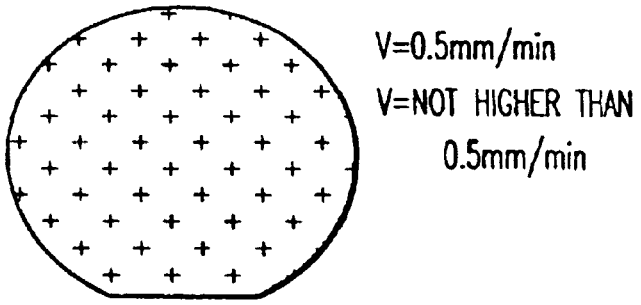
Figure 1C:
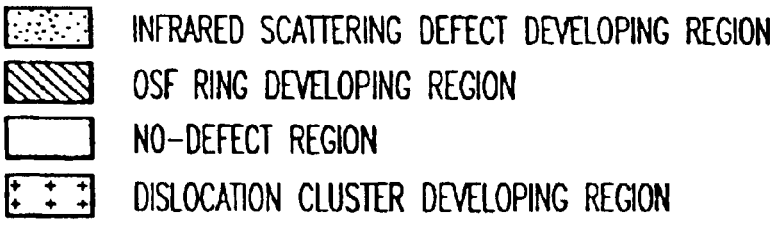

For example, when V is $V_1$, the OSF ring develops at the outermost periphery of the waver, and the infrared scattering defects occur inside thereof. This is typical behavior for the high velocity pulling rate silicon single crystal. As V is altered to slower pulling rate $V_2$ and $V_3$, the OSF ring develops at the intermediate positions a no-fault region is formed outside the ring, and infrared scattering faults develop inside the ring. This is typical for intermediate velocity raising, that corresponds to FIG. 1A. As V further decreases to $V_4$, the OSF ring shifts to the center of the wafer, leaving the defect free region outside thereof, but in the outermost periphery dislocation clusters appear. At even slower pulling rates, $V_5$, the OSF ring disappears from the center and dislocation clusters form throughout the entire wafer. This corresponds to the lower pulling rate silicon single crystal wafer shown in FIG. 1C. Even if the crystal pulling could keep V/G in the range of 0.20–0.11 $mm^2/°$ C. min where defect occurs at the center, dislocation clusters will develop outside the center due to decreasing V/G values with increasing distances from the center of the crystal.

FIG. 2 shows that if it were possible to keep the V/G value from decreasing near the periphery of the crystal then the development of defects would be preventable. The present invention was a modified CZ method to pull silicon single crystals such that the V/G value does not significantly decrease at the periphery of the crystal. The constant V/G value over the entire radial distribution of the crystal is achieved by optimizing the structure of the hot zone of the crystal pulling equipment. Thus, the present invention provides for the formation of a defect free water with the CZ method that has up to now been impossible.

G is measured along the axial direction of the crystal as determined by the aforementioned integral heat transfer analysis model. Different values of G can be given by different calculation methods. Therefore, depending on the calculation method of G, the V/G value that provides defect free crystal formation may be different than 0.20–0.22 $min^2/°$ C. min. The relative positions of the defect forming and defect free regions in FIG. 2, however, will not change with the different calculation methods used to determine G.

The wafer of this invention, being a low pulling rate wafer in which the OSF ring is obliterated at its center, does not contain the ring nor infrared scattering faults that typically occur inside thereof. Further, the dislocation clusters that form on the outside of the ring are also absent. Accordingly, a high quality wafer having fewer than 100 spots/$cm^3$, preferably fewer than 10 spots/$cm^3$, even more preferably less than 1 spot/$cm^3$ is provided.

The temperature gradients along the length of the forming silicon single crystal are not necessarily constant. As the crystal is pulled, variations in the temperature inside the CZ furnace cause changes in the temperature gradient of the crystal. In the conventional CZ method, these variations in the temperature gradient cause changes in the V/G values large enough for defects to develop in the crystal (refer to FIG. 3).

Figure 5:
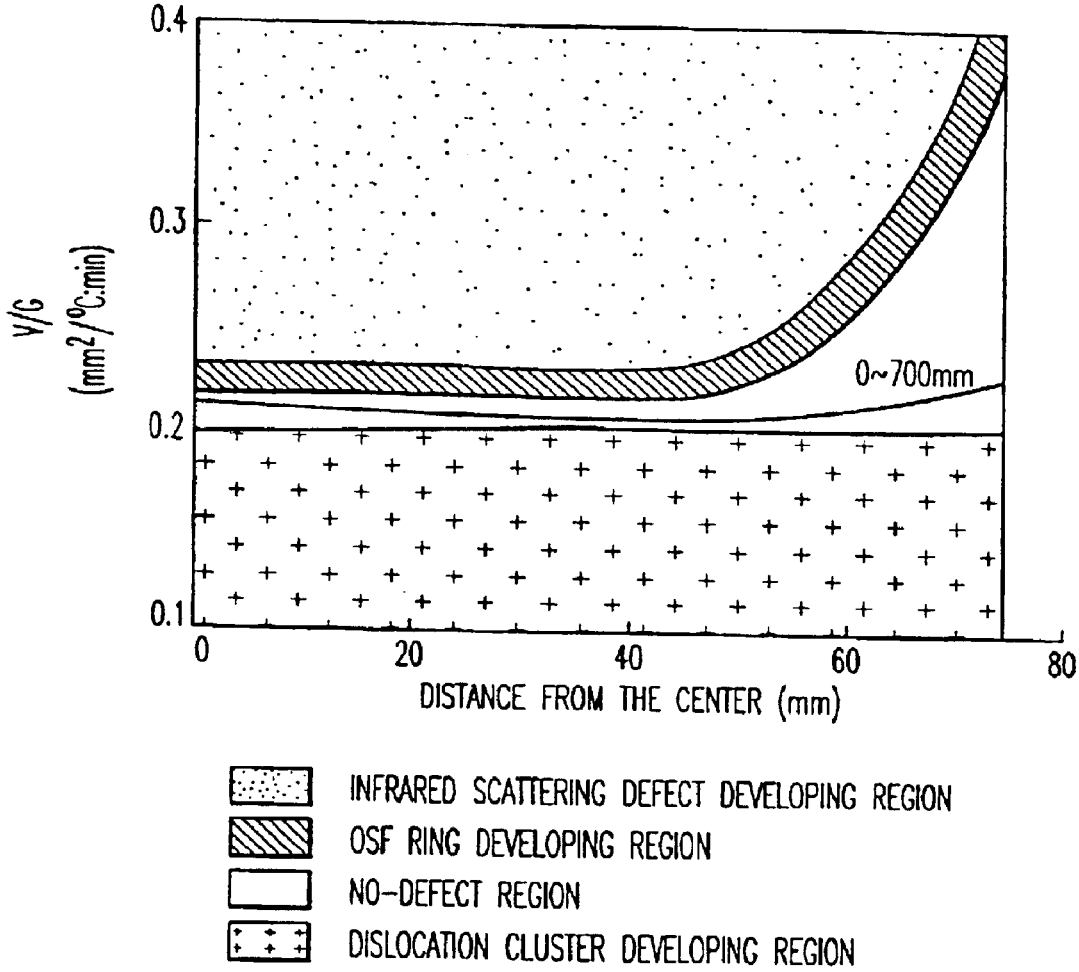
FIG. 5 displays the ways in which the development of defects are precluded over the full length in the axial direction in the graph showing the relationship (V/G curve) between the position in the radial direction of the crystal on the abscissa and the V/G level on the ordinate and the fault distributions.

To compensate for changes in the temperature gradient, G, of the crystal, the pulling rate, $V_1$ is adjusted so that a constant V/G may be achieved (refer to FIG. 5). In this way, it is possible to maintain V/G in the defect free region over the entire axial range of the crystals. In practical terms, the heater power and the pulling rate is changed in combination to maintain the V/G ratio in the defect free region of FIG. 5. The small changes required in the heating power and pulling rate to not cause defects to form in the crystal.

EXAMPLES

Having generally described this invention, a further understanding can be obtained by reference to certain specific examples which are provided herein for purposes of illustration only and are not intended to be limiting unless otherwise specified.

Figure 3:
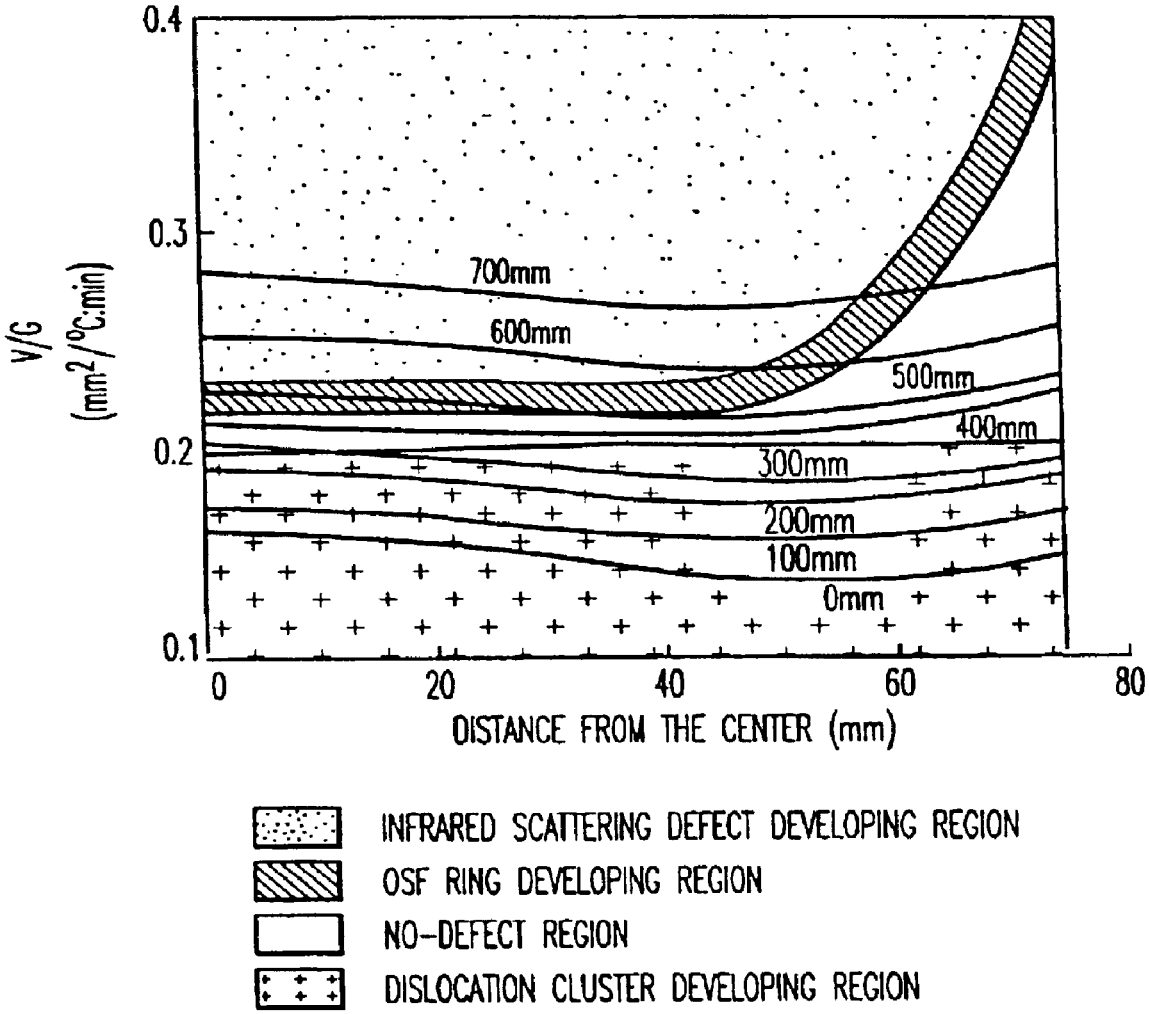
FIG. 3 indicates effect of the level at which the V/G curve is drawn in the graph showing the relationship (V/G curve) between the position in the radial direction of the crystal on the abscissa and the V/G level on the ordinate. The fault distributions indicate the effect of the crystal length on the development of defects.

One embodiment of the present invention is described as follows:

A CZ furnace capable of pulling a 6" single crystal was made by placing ail 18" quartz and carbon crucible inside a cylindrical carbon heater. A semiconical radiation shield made of carbon 5 mm thick and with a 200 mm opening diameter is installed around the crystal being pulled. A heat insulator is placed around the carbon as well. Various configurations of the crucible, carbon member, and insulators were investigated for control of the V/G value using a global heat transfer calculation model. These investigations determined the optimum pulling rate for the crystals to maintain a V/G level in the defect free region over the entire axial length of the crystal. The calculation results are shown in FIG. 3. In this graph, 0, 100, . . . and 700 mm indicate the crystal pulling length.

After determining the aforementioned conditions, 65 kg of high purity polycrystal silicon was put in the 18" quartz crucible. This polycrystal silicon doped with boron was melted by heating, and then a 150 mm single crystal with <100> crystal growth orientation was pulled to a length of 1300 mm at low pulling rate (0.45 mm/min pulling rate).

Figure 4:
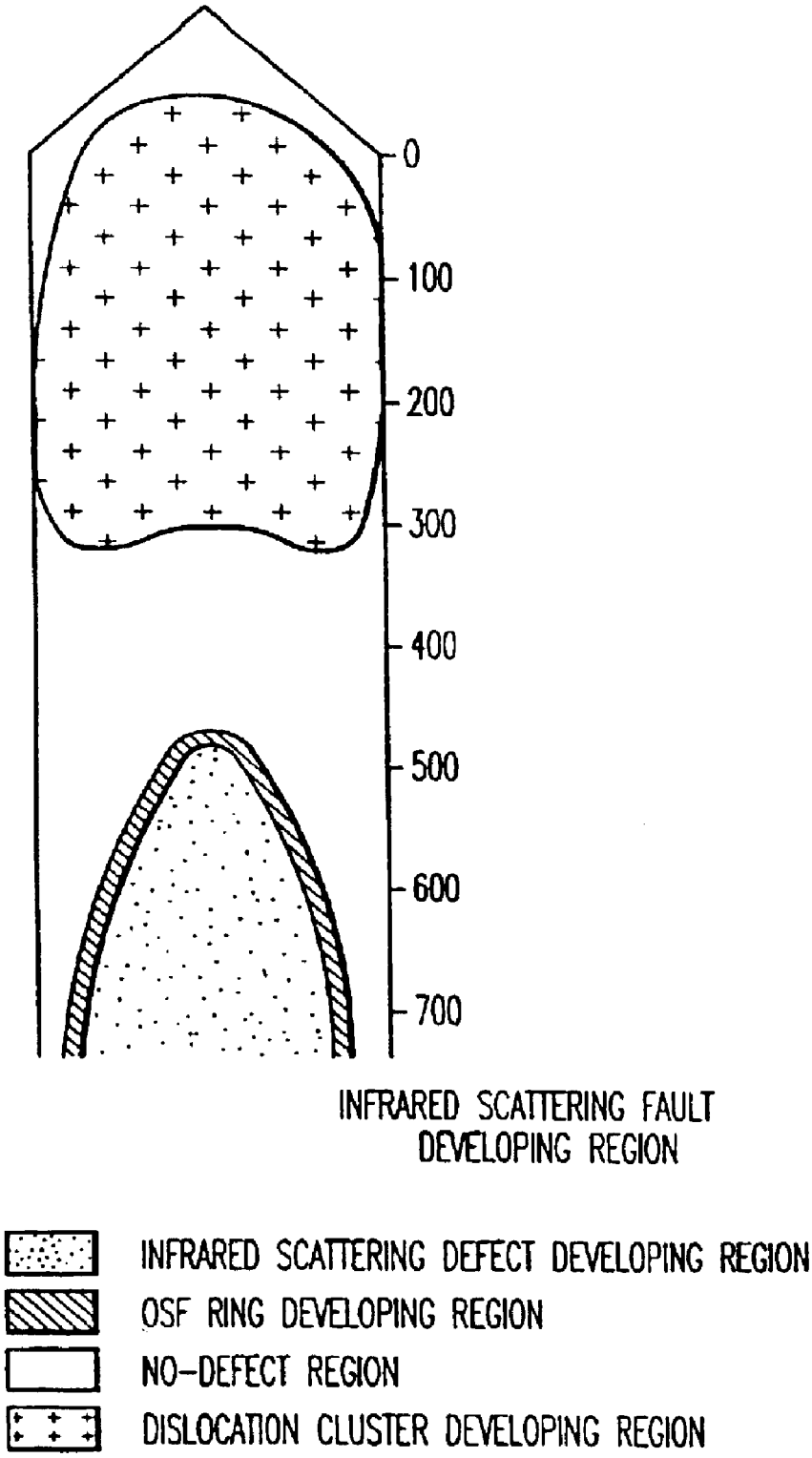
FIG. 4 is a schematic view showing the defect distributions on a plane containing the crystal axis.

From the pulled crystal, a 1.5 mm thick section was cut parallel to the axial direction of the crystal. The section was dipped in a mixed-acid solution consisting of HF and $HNO_3$ to remove the machining marks, then dipped in a dilute HF solution, and then rinsed with ultra-pure water, followed by drying. The sample was heat-treated in dry oxygen at 800° C./4 hr+1000° C./16 hr, and examined by X-ray topography for defect formation. The distribution of defects are as shown in FIG. 4. The defect distributions examined were found to be corresponding to the calculation results given in FIG. 3. It should be noted that the numerals on FIG. 4 indicate the lengths, as measured from the shoulder of the single crystal, which correspond to the pull-up levels of FIG. 3.

The ratio V/G of the pulling rate V to the temperature gradient G in the axial direction of the crystal from the melting point of silicon to 1300° C., as determined by the aforementioned integral heat transfer analysis model, is nearly constant in the range from the center of the crystal to a position at a distance of 45 mm therefrom in its radial direction, and increases slightly from that point to the outer periphery of the crystal.

The defect free silicon single crystal produced by the method of the present invention extends for about 300 mm along the length of the crystal. Conventionally, the first 200 mm of the crystal has defects because the V/G level does not rise above 0.20 $mm^2$/° C. min. From 200 mm to 500 mm, the V/G level at the center of the crystal falls in the range of 0.22–0.20 $mm^2$/° C. min, particularly in the neighborhood of the 400 mm level, the V/G level is maintained in the range of 0.22–0.20 $mm^2$/° C. min from the center to 30 mm from the periphery of the crystal, and then increases, but never leaves, the defect free region of crystal formation. Therefore, no OSF ring, infrared scattering defects, dislocation clusters or other deleterious grown-in defects were observed in this section of the crystal. From 500 mm to the crystal tail, the V/G level at the crystal center exceeded 0.22 $mm^2$/° C. min and therefore an OSF ring and infrared scattering defects occurred.

Further experimentation showed that the pulling rate could be varied to raise a defect free crystal over the entire axial length of the crystal as shown in FIG. 5. The target pull-up speeds in the axial direction of the crystal were preset to maintain the V/G level at 0.22–0.20 $min^5$/° C. min in the range from the center of crystal to a radial position by 45 mm therefrom, and V/G slowly increased from this point to the crystal periphery. Operation conditions, except for the pulling rates, were identical to the previous example. A boron doped single crystal of 6" <100> and 1300 mm in length was pulled. The distribution of defects occurred in the crystal were examined as above. No OSF ring, infrared scattering defect or dislocation cluster were found in the full axial length of the crystal.

The silicon single crystal wafer made by the method of the present invention, is thermally very stable, and is suitable for the active layer of a semiconductor device. These wafers can be used to produce high yields of gate oxide films with good junction leakage characteristics and long lifetimes. The wafer manufacturing method of this invention makes the high quality CZ silicon single crystal wafers.

The present application is based on Japanese patent application HEI 7-158458 Filed with the Japanese Patent Office on May 31, 1995, the entire contents of which are hereby incorporated by reference.

Having now fully described the invention, it will be apparent to one of ordinary skill in the art that many changes and modifications can be made thereto without departing from the spirit or scope of the invention as set forth herein.

What is claimed is:

[1. A silicon single crystal comprising less than 1 spot/$cm^3$.].

2. A silicon single crystal wafer, which contains substantially no infrared scattering defects and dislocation clusters.

3. An integrated semiconductor device comprising:

A silicon wafer according to claim 2, or a fraction of said wafer.

4. The integrated semiconductor device of claim 3, wherein said device is selected from the group consisting of MOS semiconductor devices, and LSI devices.

5. A silicon single crystal wafer, which contains an [OSF ring] *OSF-ring developing region* and a defect-free zone located substantially outside the [OSF ring] *OSF-ring developing region*.

6. An integrated semiconductor device comprising:

a silicon wafer according to claim 5, or a fraction of said wafer.

7. The integrated semiconductor device of claim 6, wherein said device is selected from the group consisting of MOS semiconductor devices, and LSI devices.

8. A silicon wafer, which is formed from a silicon single crystal ingot (except ones having diameters not more than 75 mm) that has been pulled by the Czochralski method, comprising, exclusively:

an OSF-ring developing region; and a grown-in defect free region.

9. A silicon wafer, which is formed from a silicon single crystal ingot (except ones having diameters not more than 75 mm) that has been pulled by the Czochralski method, comprising, exclusively:

an infrared scattering defect developing region;

an OSF-ring developing region; and a grown-in defect free region.

10. A silicon single crystal, which is pulled using a CZ furnace that, at a high temperature range close to the melting point of silicon, has an axial temperature gradient at the surface of the crystal lower than that at the center of the crystal.

11. A silicon single crystal, which is pulled using a CZ furnace that, at a high temperature range close to a melting point of silicon, has an axial temperature gradient at the surface of the crystal lower than that at the center of the crystal, and on condition that the center of the crystal constitutes a grown-in defect free region.

12. A silicon single crystal, which is pulled using a CZ furnace that, at a high temperature range close to a melting point of silicon, has an axial temperature gradient at a surface of the crystal lower than that at a center of the crystal, and on condition that the center of the crystal constitutes an OSF-ring developing region.

13. A silicon single crystal, which is pulled using a CZ furnace that, at a high temperature range close to a melting point of silicon, has an axial temperature gradient at the surface of the crystal lower than that at the center of the crystal, and on condition that the center of the crystal constitutes an infrared scattering defect developing region.

14. A silicon single crystal, which is formed by creating a defect distribution diagram clearly showing a defect distribution in relation to a V/G' value and a radial location in the crystal, defining a hot zone structure such that a V/G' curve showing a changes of the V/G' value in a radial direction of the crystal passes through a desired region in said defect distribution diagram, and pulling the crystal in the defined hot zone structure, where V is a pulling rate when a silicon single crystal is pulled by the Czochralski method, and G' is an axial temperature gradient at a high temperature range close to the melting point of silicon.

15. A silicon single crystal according to claim 14, wherein the axial temperature gradient G' is a mean value (G) of the temperature gradient of the axial direction in a range from the melting point of silicon to 1300° C.

16. A silicon single crystal according to claim 14, wherein the axial temperature gradient G' is determined from an axial temperature distribution which is calculated from the temperature at a surface of the crystal given by a global heat transfer model calculation and the temperature (the melting point of silicon) at the solid-liquid interface given by measuring the shape of the solid-liquid interface of the actual crystal as boundary conditions.

17. A silicon single crystal, which is formed by pulling the crystal by adjusting a pulling rate V such that a V/G' value is constant to changes of an axial temperature gradient G' associated with the progress of pulling of the crystal, where V is a pulling rate when pulling a silicon crystal by the Czochralski method, and G' is the axial temperature gradient at a high temperature range close to a melting point of silicon.

18. A silicon single crystal according to claim 17, wherein the target V/G' value is maintained by keeping a mean value of the pulling rate V at a target value while changing the pulling rate V in combination with, or independently of, the control of heater power to control a crystal diameter.

19. A silicon single crystal according to claim 17, wherein the axial temperature gradient G' is a mean value (G) of a temperature gradient of the axial direction in a range from the melting point of silicon to 1300° C.

20. A silicon single crystal according to claim 17, wherein the axial temperature gradient G' is determined from a temperature distribution which is calculated from the temperature at a surface of the crystal given by a global heat transfer model calculation and the temperature (the melting point of silicon) at a solid-liquid interface given by measuring the shape of the solid-liquid interface of the actual crystal as boundary conditions.

21. A silicon single crystal, which is formed by the process comprising: surveying the axial changes in a radial defect distribution in the crystal being pulled, setting a target pulling rate V in a direction of a pulling axis to maintain the V/G' at constant value in a direction of the pulling axis, and pulling the crystal according to the target V, where V is a pulling rate when a silicon single crystal is pulled by the Czochralski method, and G' is an axial temperature gradient at a high temperature range close to a melting point of silicon.

22. A silicon single crystal according to claim 21, wherein the axial temperature gradient G' is a mean value (G) of the temperature gradient in axial direction in a range from the melting point of silicon to 1300° C.

23. A silicon single crystal according to claim 21, wherein the axial temperature gradient G' is determined from a temperature distribution which is calculated from the temperature at a surface of the crystal given by a heat transfer model calculation and a temperature (the melting point of silicon) at a solid-liquid interface given by measuring the shape of the solid-liquid interface of the actual crystal as boundary conditions.

* * * * *